United States Patent
Bangar et al.

(10) Patent No.: US 9,343,309 B1
(45) Date of Patent: May 17, 2016

(54) LATERAL OXIDATION PROCESS FLOWS

(71) Applicant: APPLIED MATERIALS, INC., Santa Clara, CA (US)

(72) Inventors: Mangesh Bangar, San Jose, CA (US); Liyan Miao, San Francisco, CA (US); Huixiong Dai, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 14/657,693

(22) Filed: Mar. 13, 2015

(51) Int. Cl.
 *H01L 21/033* (2006.01)
 *H01L 21/471* (2006.01)
 *H01L 21/473* (2006.01)
 *H01L 21/308* (2006.01)

(52) U.S. Cl.
 CPC ........ *H01L 21/0337* (2013.01); *H01L 21/0332* (2013.01); *H01L 21/0338* (2013.01); *H01L 21/3086* (2013.01); *H01L 21/3088* (2013.01); *H01L 21/471* (2013.01); *H01L 21/473* (2013.01)

(58) Field of Classification Search
 CPC ............ H01L 21/0337; H01L 21/0338; H01L 21/3086; H01L 21/471; H01L 21/473
 See application file for complete search history.

(56) References Cited

U.S. PATENT DOCUMENTS

2014/0273441 A1   9/2014   Tae-Soo

*Primary Examiner* — Amar Movva
(74) *Attorney, Agent, or Firm* — Kilpatrick Townsend & Stockton LLP

(57) ABSTRACT

Methods of laterally oxidizing features of a patterned substrate are described. A capping layer may be disposed above lateral features to laterally confine the oxidation. The oxidizable features may be material patterned near the optical resolution of a photolithography system using a high-resolution photomask. The oxidizable features may be wider than the spaces between the oxidizable features and may be about three times the width of the spaces. Oxidized portions may be formed on either side of repeated oxidizable features. The unoxidized portions may then be removed as part of a self-aligned double patterning (SADP) process. A gapfill layer deposited thereon may be etched or polished back to form alternating fill and non-sacrificial features.

15 Claims, 6 Drawing Sheets

LATERAL OXIDATION PROCESS FLOWS

FIELD

The subject matter herein relates to oxidizing patterned substrates.

BACKGROUND

Shrinking integrated circuits (ICs) may result in improved performance, increased capacity and/or reduced cost. Each device shrink requires more sophisticated techniques to form the features. Photolithography is commonly used to pattern features on a substrate. An exemplary feature is a line of a material which may be a metal, semiconductor or insulator. Linewidth is the width of the line and the spacing is the distance between adjacent lines. Pitch is defined as the distance between a same point on two neighboring lines. The pitch is equal to the sum of the linewidth and the spacing. Due to factors such as optics and light or radiation wavelength, however, photolithography techniques have a minimum pitch below which a particular photolithographic technique may not reliably form features. Thus, the minimum pitch of a photolithographic technique can limit feature size reduction.

Self-aligned double patterning (SADP) is one method for extending the capabilities of photolithographic techniques beyond their supposed minimum pitch. Such a method is illustrated in FIGS. 1A-1H. With reference to FIG. 1A, patterned features 102 are formed from sacrificial structural material above a dielectric layer (or more generally an underlying layer or underlayer 114) on a substrate 101 using standard photo-lithography and etching techniques. The patterned features are referred to as placeholders, mandrels or cores and have linewidths and/or spacings near the optical resolution of a photolithography system using a high-resolution photomask. As shown in FIG. 1B, a conformal layer 106 of hard mask material is subsequently deposited over cores 102. Hard mask spacers 108 are then formed on the sides of cores 102 by preferentially etching the hard mask material from the horizontal surfaces with an anisotropic spacer etch. The resulting structure is shown in FIG. 1C. Cores 102 may then be removed, leaving behind hard mask spacers 108 (FIG. 1D). At this point hard mask spacers 108 may be used as an etch mask for transferring the pattern to underlayer 114 to form dielectric ribs 116, as shown in FIG. 1E. The hard mask spacers 108 are subsequently removed (FIG. 1F).

The density of the dielectric ribs 116 is twice that of the photo-lithographically patterned features 102, the pitch of dielectric ribs 116 is half the pitch of patterned features 102. A metal layer 130 is deposited over the dielectric ribs 116 and exposed portions of the substrate 101 (FIG. 1G) and subsequently etched back or polished to form metal lines 132 between the dielectric ribs 116 as shown in FIG. 1H. Methods are needed to improve the uniformity and yield of density increasing techniques such as the technique of FIGS. 1A-1H.

SUMMARY

Methods of laterally oxidizing features of a patterned substrate are described. A capping layer may be disposed above lateral features to laterally confine the oxidation. The oxidizable features may be material patterned near the optical resolution of a photolithography system using a high-resolution photomask. The oxidizable features may be wider than the spaces between the oxidizable features and may be about three times the width of the spaces. Oxidized portions may be formed on either side of repeated oxidizable features. The unoxidized portions may then be removed as part of a self-aligned double patterning (SADP) process. A gapfill layer deposited thereon may be etched or polished back to form alternating fill and non-sacrificial features.

Embodiments include methods of forming features on a substrate. The methods include forming a layer of sacrificial structural material on the substrate. The methods further include patterning the layer of sacrificial structural material using a photolithography process to form a plurality of cores. At least one of the plurality of cores has a first linewidth and the plurality of cores are separated by first trenches and spaced according to a first pitch. The methods further include laterally oxidizing the plurality of cores to form a plurality of oxidation spacers around a plurality of unoxidized cores. At least one of the plurality of unoxidized cores has a second linewidth and the at least one of the plurality of caps retains the first linewidth. The methods further include removing the plurality of cores leaving the plurality of oxidation spacers separated by second trenches and spaced according to a second pitch that is less than the first pitch. At least one of the plurality of oxidation spacers has a third linewidth.

The second pitch at which the plurality of oxidation spacers are spaced may be half the first pitch. The first linewidth may be between about 70% and about 80% of the first pitch. The second linewidth may be between about 20% and about 30% of the first pitch. The third linewidth may be between about 20% and about 30% of the first pitch. The layer of sacrificial structural material may be a silicon-containing material. The layer of sacrificial structural material may be amorphous silicon or polysilicon or silicon nitride.

Embodiments include methods of forming features on a substrate. The methods include forming a layer of sacrificial structural material on the substrate. The methods further include forming a capping layer on the layer of sacrificial structural material. The methods further include patterning the capping layer and the layer of sacrificial structural material using a photolithography process to form a plurality of cores topped by a plurality of caps. At least one of the plurality of cores and at least one of the plurality of caps has a first linewidth and the plurality of cores and the plurality of caps are separated by first trenches and spaced according to a first pitch. The methods further include laterally oxidizing the plurality of cores to form a plurality of oxidation spacers around a plurality of unoxidized cores. At least one of the plurality of unoxidized cores has a second linewidth and the at least one of the plurality of caps retains the first linewidth. The methods further include removing the plurality of cores leaving the plurality of oxidation spacers separated by second trenches and spaced according to a second pitch that is less than the first pitch. At least one of the plurality of oxidation spacers has a third linewidth.

The first linewidth may be three-quarters of the first pitch. The second linewidth may be one quarter of the first pitch. The third linewidth may be one quarter of the first pitch.

Embodiments include methods of forming features on a patterned substrate. The methods include placing the patterned substrate into a substrate processing region. The patterned substrate has a plurality of cores. Each of the plurality of cores has an unoxidizable cap and each of the plurality of cores has a first linewidth and neighboring pairs of the plurality of cores are separated by trenches and spaced according to a first pitch. The methods further include flowing an oxygen-containing precursor into the substrate processing region. The methods further include laterally oxidizing the plurality of cores to form a plurality of oxidation spacers around a plurality of unoxidized cores. Each of the plurality of unoxidized cores has a second linewidth which is one third the first linewidth and the unoxidizable cap still has the first linewidth.

The methods may further include removing the plurality of cores leaving the plurality of oxidation spacers separated by second trenches and spaced according to a second pitch that is less than the first pitch. The oxygen-containing precursor may include one or more of ozone, moisture ($H_2O$) and oxygen ($O_2$). The unoxidizable cap may be silicon nitride, titanium oxide or titanium nitride.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

DESCRIPTION OF THE DRAWINGS

A further understanding of the nature and advantages of the embodiments may be realized by reference to the remaining portions of the specification and the drawings.

Figure 1A:
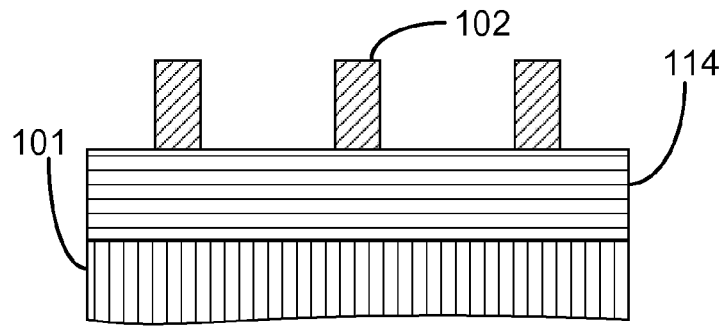
FIGS. 1A, 1B, 1C, 1D, 1E, 1F, 1G and 1H are cross-sectional views during a prior art self-aligned double patterning process.
Figure 1B:
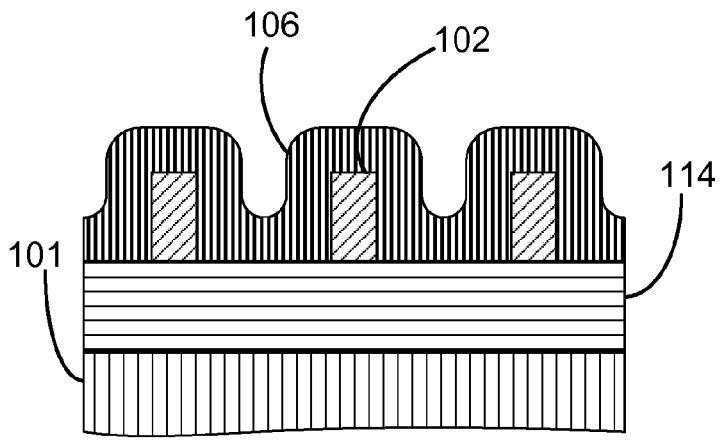
Figure 1C:
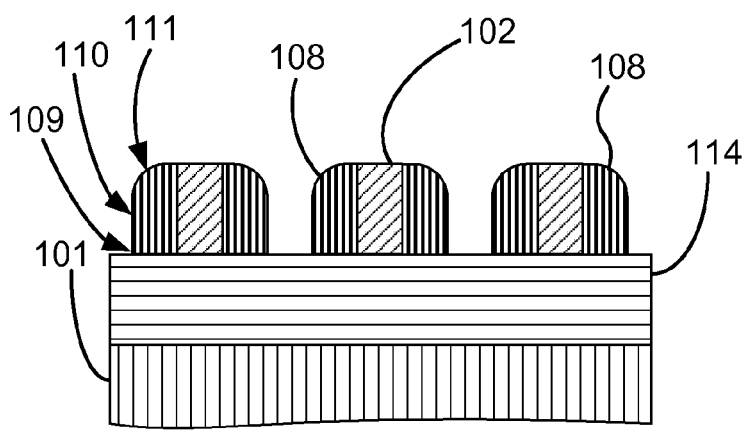
Figure 1D:
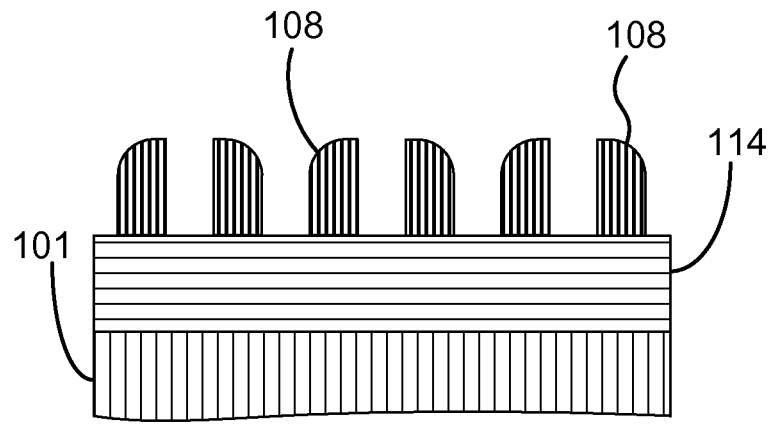
Figure 1E:
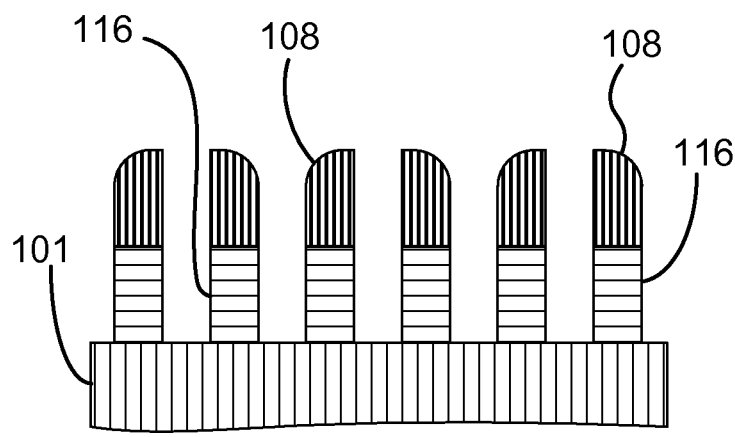
Figure 1F:
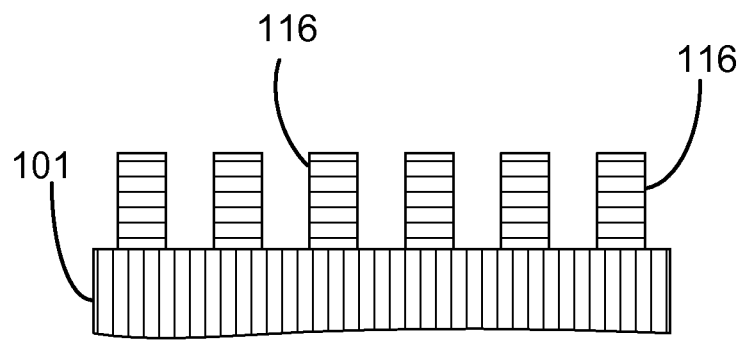
Figure 1G:
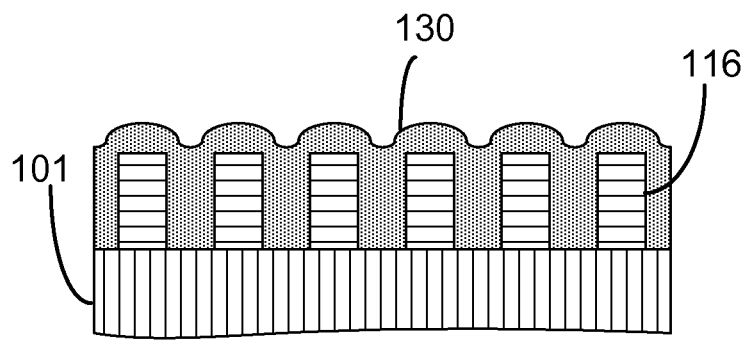
Figure 1H:
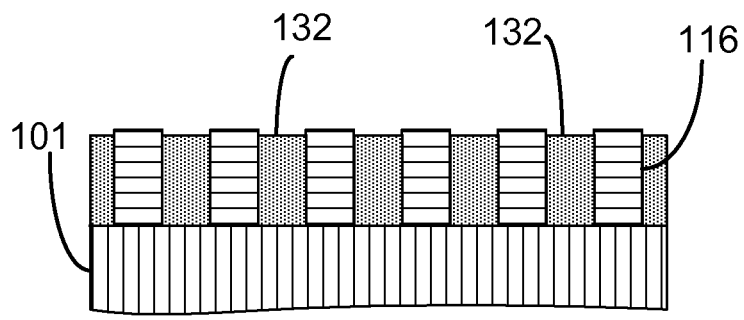

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Methods of laterally oxidizing features of a patterned substrate are described. A capping layer may be disposed above lateral features to laterally confine the oxidation. The oxidizable features may be material patterned near the optical resolution of a photolithography system using a high-resolution photomask. The oxidizable features may be wider than the spaces between the oxidizable features and may be about three times the width of the spaces. Oxidized portions may be formed on either side of repeated oxidizable features. The unoxidized portions may then be removed as part of a self-aligned double patterning (SADP) process. A gapfill layer deposited thereon may be etched or polished back to form alternating fill and non-sacrificial features.

Self-aligned double patterning (SADP) has previously involved depositing conformal layer 106 on thin cores 102 such that a space remains between horizontal faces of conformal layer 106 roughly equivalent to the thickness of core 102 itself. A directional etch than removes portions of conformal layer 106 above core 102 and above underlayer 114 in the space between the horizontal faces of the conformal layer. Following the directional etch, spacers 108 are created on the sides of each core. However, spacers 108 have rounded tops/corner rounding 111 on the sides opposite the cores regardless of the degree of conformality of conformal layer 106. Spacers 108 also have footers (location shown as 109) or extra core material sticking out at the bottom (not shown) bordering the underlayer 114. Spacers 108 may also have residue or oxidation on the sides (location shown as 110). Embodiments described herein may result in no rounding, no footing and/or no residue/oxidation on the sides of spacers 108 or other features formed using the present methods. Benefits of the embodiments include increased yield or performance of resulting integrated circuits as a result of the lack of rounding, footers or residue/oxidation on the features.

Figure 2:
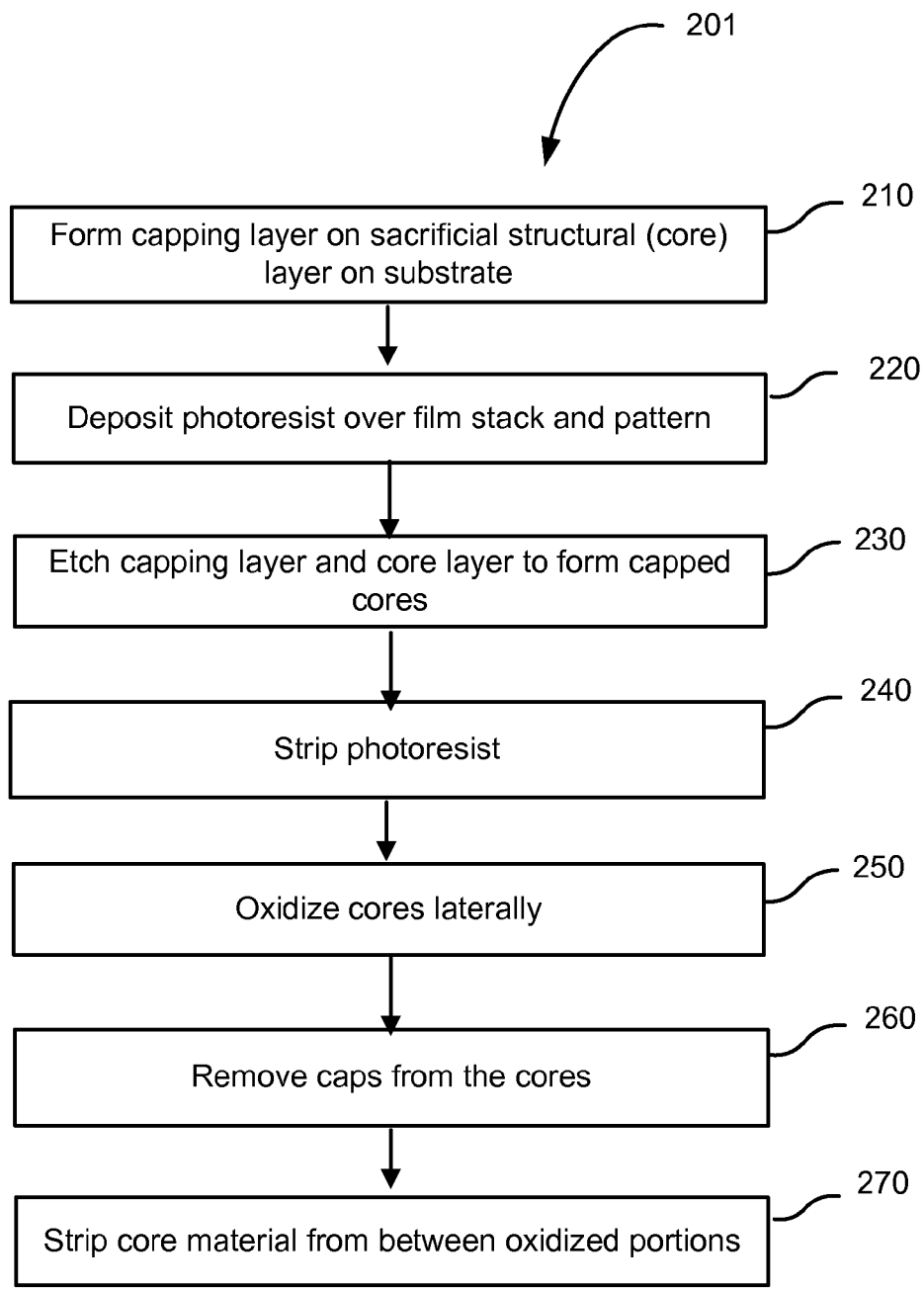
FIG. 2 is a flow chart of a surface-oxidation double patterning (SODP) process according to embodiments.

To better understand and appreciate the embodiments described herein, reference is made to FIG. 2, which is a flowchart depicting steps associated with a self-aligned double patterning process 201 according to embodiments. Reference will also be made to FIGS. 3A-E, which illustrate cross-sectional views of a structure as it is formed by associated self-aligned double patterning processes. The method starts by forming a sacrificial structural layer (sometimes referred to as a core layer) on an underlayer 314 on a substrate 301 (operation 210). Underlayer 314 may be part of substrate 301 in embodiments. A capping layer is formed on the core layer in operation 210 as well. The core layer is coated with photoresist, the photoresist is patterned and developed (operation 220). The pattern is transferred into the capping layer and the core layer (operation 230) with an etch process to form cores 302-1 with capping layers 305 remaining. Capping layer 305 will be used to guide the direction of oxidation in a later operation. In operation 240, the photoresist is removed to achieve the structure shown in FIG. 3A. With this process, the gaps between cores 302-1 may be patterned at or near the resolution limit of a photolithography process. In practice, integrated circuits will possess a variety of lines and spacings. The cross-sectional views in FIGS. 3A-F depict a densely patterned portion of the integrated circuit having relatively small pitch, linewidth and spacing.

Cores 302-1 start off wider than the cores 102 of FIG. 1 to allow space for forming oxidation spacers 308-1 in the manner described shortly. Cores 302-1 may be polysilicon, amorphous silicon, silicon nitride or silicon-containing material according to embodiments. Capping layer 305 is a material which is essentially unaffected by exposure to oxygen or another oxygen-containing precursor at the temperatures described herein. Capping layer 305 may be referred to as an unoxidizable cap and may not react with oxygen in embodiments. Similarly, underlayer 314 may not react with oxygen in embodiments. Capping layer 305 and/or underlayer 314 may be already oxidized (each may be an oxide layer) and therefore resist further oxidation according to embodiments. Exemplary materials will be described shortly. The patterned substrate is exposed to oxygen ($O_2$) in operation 250 to oxidize cores 302-1 laterally and form oxidation spacers 308-1 shown in FIG. 3B. Generally speaking, the oxygen-containing precursor may include one or more of ozone, moisture ($H_2O$) and oxygen ($O_2$) according to embodiments. During the oxidation of operation 250 the substrate temperature may be below 300° C., below 250° C., or preferably below 200° C., according to embodiments. The capping layer is removed in operation 260 (shown in FIG. 3C) and the unoxidized cores 302-2 are removed in operation 270 (shown thereafter in FIG. 3D. No anisotropic (directional) etch is necessary to perform the self-aligned double patterning process 201 represented in FIG. 2. Only isotropic etch processes are used in self-aligned double patterning process 201 in embodiments.

Figure 3A:
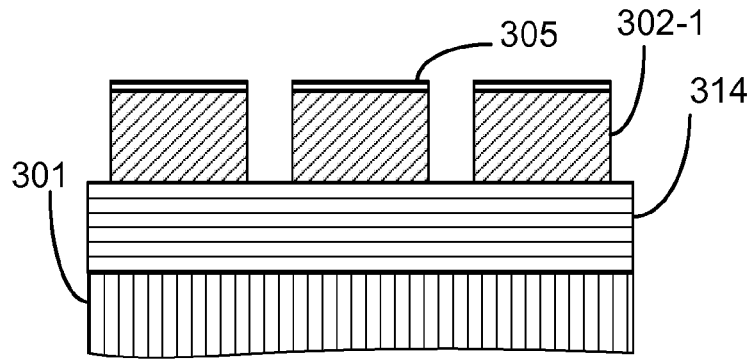
FIGS. 3A, 3B, 3C, 3D and 3E are cross-sectional views during a surface-oxidation double patterning process chamber according to embodiments.
Figure 3B:
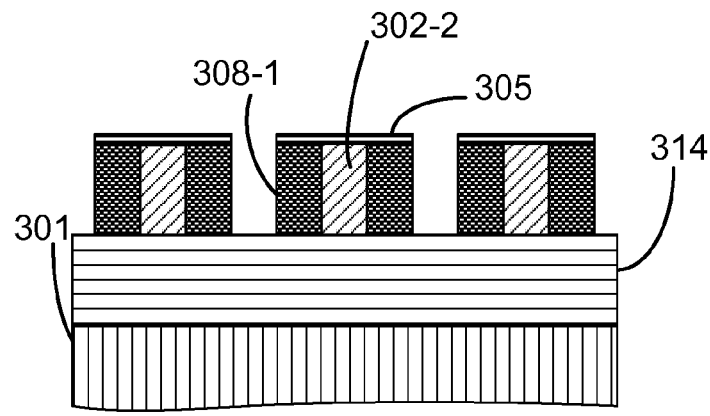
Figure 3C:
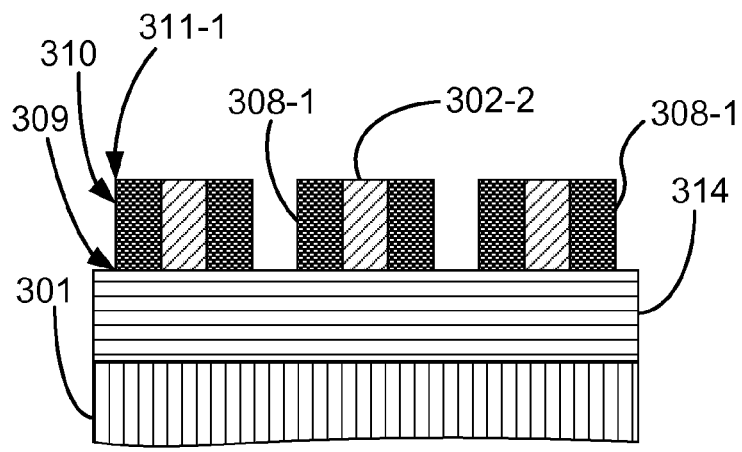
Figure 3D:
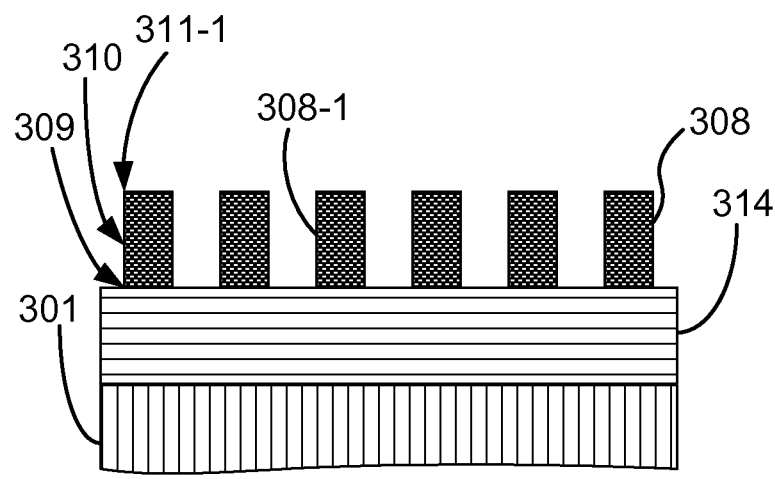

Locations have been marked on FIG. 3C which correspond to footer location 109, side residue location 110 and corner rounding location 111, each shown in FIG. 1. The corresponding locations are footer location 309, side residue location 310 and corner rounding location 311. Spacers 108 have no tops/corner rounding 311 on the sides opposite the cores because a conformal layer was not relied upon to form the spacers on the core. Spacers 108 also have no footers extending beyond the prevailing wall of core 311-1 (location shown as 109) along underlayer 314 for the same reason. Spacers 308-1 also may have no residue or oxidation on the sides (location shown as 310) since a directional etch was not relied upon to separate the spacers. Spacers 308-1 are separated upon formation using the embodiments described herein.

"Top" and "Up" will be used herein to describe portions/directions perpendicularly distal from the substrate plane and further away from the center of mass of the substrate in the perpendicular direction. "Vertical" will be used to describe items aligned in the "Up" direction towards the "Top". "Depth" will be used to describe lengths in the vertical direction and "width" will be used to describe lengths parallel to the substrate plane and in the plane of the views indicating the smallest widths of the spaces between cores 302-1 or smallest widths of cores 302-2 (in the plane of the views of FIGS. 3A-3E). Other similar terms may be used whose meanings will now be clear. The width of core 302-1 is larger than the width of core 102. The width of core 302-1 may be greater than the width of the spaces between nearest neighbor cores 302-1. The width of core 302-1 may be about three times the width of the spaces between nearest neighbor cores 302-1 according to embodiments. The width of core 302-1 may be about equal to the width of core 102 in FIGS. 1A-1E. The capping layer may be referred to as a non-oxidizing capping layer to indicate that the non-oxidizing capping layer undergoes negligible or no chemical reactions when exposed to the oxygen-containing precursor. The width of core 302-1 and capping layer 305 in FIG. 3A (after patterning) may be about three quarters of the pitch of the pattern. Core 302-2 and spacer 308-1 may be about one quarter of the original pitch (at FIG. 3A) and about one half of the new pitch once the density is doubled (at FIG. 3D) in embodiments.

Spacer 308-1 (and/or core 302-2) may have widths between 0 nm and 15 nm or between 1 nm and 10 nm according to embodiments. For dry oxygen-containing precursors ($O_3$, $O_2$), spacer 308-1 (and/or core 302-2) may have widths between 0 nm and 4 nm or between 1 nm and 3 nm in embodiments. For the wet oxygen-containing precursor ($H_2O$), spacer 308-1 (and/or core 302-2) may have widths between 1 nm and 15 nm, between 4 nm and 12 nm or between 6 nm and 10 nm in embodiments.

The core 302-1 to spacing ratio may be selected using a variety of techniques. Prior art techniques require thinner cores and may use an extra layer between the photoresist and the core. The extra layer may be a silicon oxycarbide layer and may provide a length through which an etch can either dig a wider and wider space as the etch approaches the sacrificial structural layer of material (suitable for prior art processes such as FIG. 1A-H). Such an etch process are typically referred to as an "etch trim" process which refers to the narrow dimensions of cores 102. In contrast, a process may dig a narrower and narrower space as the etch approaches the sacrificial structural layer of material which may be desirable for the embodiments described herein. An etch process which digs narrower and narrower is referred to as an "etch shrink" process, a reference to the small gaps which can be achieved with the technique. An etch shrink process may be used to form wider cores 302-1 described herein.

Capping layer 305 (the unoxidizable cap) may be silicon nitride, titanium oxide or titanium nitride according to embodiments. Capping layer 305 may consist of silicon and nitrogen, consist of titanium and nitrogen or consist of titanium and oxygen in embodiments. Similarly, underlayer 314 may be silicon nitride, silicon oxide, titanium nitride or titanium oxide according to embodiments. Underlayer 314 may consist of silicon and nitrogen, consist of silicon and oxygen, consist of titanium and nitrogen or consist of titanium and oxygen in embodiments. Underlayer 314 and capping layer 305 may be different materials to allow the capping layer to be removed without affecting the underlayer, so for example, capping layer 305 may be titanium nitride and the underlayer may be titanium oxide.

Figure 3E:
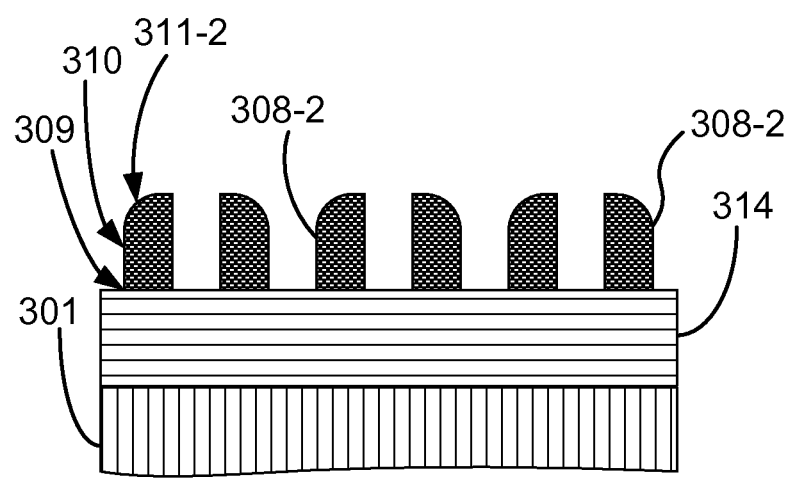

Self-aligned double patterning process 201 may be simplified in a variety of ways to provide at least a portion of the benefits described previously. Capping layer 305 may be omitted from self-aligned double patterning process 201 and the resulting structure is shown in FIG. 3E. Footers are still avoided in footer location 309 and side residue/surface oxidation is still avoided at side residue location 310. On the other hand, the absence of capping layer 305 enables oxidation operation 250 to round the edges of spacers 308-2 disposed on the side opposite cores 302-2. Benefits are still significant in using this modified version of self-aligned double patterning process 201. Without a capping layer, underlayer 314 may be silicon nitride, titanium nitride or titanium oxide according to embodiments. Underlayer 314 may consist of silicon and nitrogen, consist of titanium and nitrogen or consist of titanium and oxygen in embodiments.

In the preceding description, for the purposes of explanation, numerous details have been set forth to provide an understanding of embodiments of the subject matter described herein. It will be apparent to one skilled in the art, however, that certain embodiments may be practiced without some of these details, or with additional details.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon" or "polysilicon" of the patterned substrate is predominantly Si but may include minority concentrations of other elemental constituents such as nitrogen, oxygen, hydrogen and carbon. Exposed "silicon" or "polysilicon" may consist of or consist essentially of silicon. Exposed "silicon nitride" of the patterned substrate is predominantly silicon and nitrogen but may include minority concentrations of other elemental constituents such as oxygen, hydrogen and carbon. "Exposed silicon nitride" may consist essentially of or consist of silicon and nitrogen. Exposed "silicon oxide" of the patterned substrate is predominantly $SiO_2$ but may include minority concentrations of other elemental constituents such as nitrogen, hydrogen and carbon. In embodiments, silicon oxide films etched using the methods taught herein consist essentially of or consist of silicon and oxygen. Analogous definitions will be understood for "tungsten", "titanium", "aluminum", "tantalum" and "copper".

The term "precursor" is used to refer to any process gas which takes part in a reaction to either remove material from or deposit material onto a surface. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The term "gap" is used with no implication that the etched geometry has a large length-to-width aspect ratio. Viewed from above the surface, gaps may appear circular, oval, polygonal, rectangular, or a variety of other shapes. The term "gap" refers to a "trench" or a "via". A length-to-width aspect ratio of the via may be about 1:1, as viewed from above, whereas a length-to-width aspect ratio of the trench may be greater than 10:1. A trench may be in the shape of a moat around an island of material in which case the length-to-width aspect ratio would be the circumference divided by the width of the gap averaged around the circumference. The term "via" is used to refer to a low length-to-width aspect ratio trench which may or may not be filled with metal to form a vertical electrical connection. As used herein, a conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the embodiments described herein. Accordingly, the above description should not be taken as limiting the scope of the claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the embodiments described, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of forming features on a substrate, the method comprising:
   forming a layer of sacrificial structural material on the substrate;
   patterning the layer of sacrificial structural material using a photolithography process to form a plurality of cores; wherein at least one of the plurality of cores has a first linewidth and the plurality of cores are separated by first trenches and spaced according to a first pitch;
   laterally oxidizing the plurality of cores to form a plurality of oxidation spacers around a plurality of unoxidized cores, wherein at least one of the plurality of unoxidized cores has a second linewidth and the at least one of the plurality of caps retains the first linewidth; and
   removing the plurality of cores leaving the plurality of oxidation spacers separated by second trenches and spaced according to a second pitch that is less than the first pitch, wherein at least one of the plurality of oxidation spacers has a third linewidth.

2. The method of claim 1 wherein the second pitch at which the plurality of oxidation spacers are spaced is half the first pitch.

3. The method of claim 1 wherein the first linewidth is between about 70% and about 80% of the first pitch.

4. The method of claim 1 wherein the second linewidth is between about 20% and about 30% of the first pitch.

5. The method of claim 1 wherein the third linewidth is between about 20% and about 30% of the first pitch.

6. The method of claim 1 wherein the layer of sacrificial structural material is a silicon-containing material.

7. The method of claim 1 wherein the layer of sacrificial structural material is amorphous silicon or polysilicon.

8. A method of forming features on a substrate, the method comprising:
   forming a layer of sacrificial structural material on the substrate;
   forming a capping layer on the layer of sacrificial structural material;
   patterning the capping layer and the layer of sacrificial structural material using a photolithography process to form a plurality of cores topped by a plurality of caps; wherein at least one of the plurality of cores and at least one of the plurality of caps has a first linewidth and the plurality of cores and the plurality of caps are separated by first trenches and spaced according to a first pitch;
   laterally oxidizing the plurality of cores to form a plurality of oxidation spacers around a plurality of unoxidized cores, wherein at least one of the plurality of unoxidized cores has a second linewidth and the at least one of the plurality of caps retains the first linewidth; and
   removing the plurality of cores leaving the plurality of oxidation spacers separated by second trenches and spaced according to a second pitch that is less than the first pitch, wherein at least one of the plurality of oxidation spacers has a third linewidth.

9. The method of claim 8 wherein the first linewidth is three-quarters of the first pitch.

10. The method of claim 8 wherein the second linewidth is one quarter of the first pitch.

11. The method of claim 8 wherein the third linewidth is one quarter of the first pitch.

12. A method of forming features on a patterned substrate, the method comprising:
   placing the patterned substrate into a substrate processing region, wherein the patterned substrate has a plurality of cores, wherein each of the plurality of cores has an unoxidizable cap and each of the plurality of cores has a first linewidth and neighboring pairs of the plurality of cores are separated by trenches and spaced according to a first pitch;
   flowing an oxygen-containing precursor into the substrate processing region; and
   laterally oxidizing the plurality of cores to form a plurality of oxidation spacers around a plurality of unoxidized cores, wherein each of the plurality of unoxidized cores has a second linewidth which is one third the first linewidth and wherein the unoxidizable cap still has the first linewidth.

13. The method of claim 12 further comprising removing the plurality of cores leaving the plurality of oxidation spacers separated by second trenches and spaced according to a second pitch that is less than the first pitch.

14. The method of claim 12 wherein the oxygen-containing precursor comprises one or more of ozone, moisture ($H_2O$) and oxygen ($O_2$).

15. The method of claim 12 wherein the unoxidizable cap is silicon nitride, titanium oxide or titanium nitride.

* * * * *